(12) United States Patent
Kuo et al.

(10) Patent No.: US 9,812,614 B2
(45) Date of Patent: Nov. 7, 2017

(54) LIGHT-EMITTING DEVICE

(71) Applicant: LEXTAR ELECTRONICS CORPORATION, Hsinchu (TW)

(72) Inventors: Shiou-Yi Kuo, Kaohsiung (TW); Shih-Huan Lai, Changhua County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 15/176,102

(22) Filed: Jun. 7, 2016

(65) Prior Publication Data

US 2016/0365496 A1 Dec. 15, 2016

(30) Foreign Application Priority Data

Jun. 10, 2015 (TW) .............................. 104118713 A

(51) Int. Cl.
| | | |
|---|---|---|
| H01L 33/00 | (2010.01) | |
| H01L 33/40 | (2010.01) | |
| H01L 33/38 | (2010.01) | |
| H01L 33/62 | (2010.01) | |
| H01L 33/46 | (2010.01) | |

(52) U.S. Cl.
CPC ............ *H01L 33/405* (2013.01); *H01L 33/38* (2013.01); *H01L 33/46* (2013.01); *H01L 33/62* (2013.01)

(58) Field of Classification Search
USPC ...................... 257/13, 40, 79–103, 191, 918, 257/E51.018–E51.022, E33.001–E33.077, 257/E33.054, E25.028, E25.032, 458, 257/656, E33.046, E29.336, E31.036, 257/E31.087–E31.088, E31.061–E31.062; 438/22–47, 69, 493, 503, 507, 956
See application file for complete search history.

(56) References Cited

U.S. PATENT DOCUMENTS

| | | | |
|---|---|---|---|
| 6,784,462 B2* | 8/2004 | Schubert | H01L 33/405 257/103 |
| 7,265,392 B2 | 9/2007 | Hahn et al. | |
| 7,498,609 B2* | 3/2009 | Murofushi | H01L 33/405 257/99 |
| 7,692,203 B2* | 4/2010 | Konno | H01L 33/22 257/79 |
| 8,436,393 B2 | 5/2013 | Hahn et al. | |
| 2009/0278145 A1* | 11/2009 | Sakai | H01L 33/22 257/98 |
| 2010/0200884 A1* | 8/2010 | Lee | H01L 33/0079 257/98 |
| 2011/0101404 A1* | 5/2011 | Fu | H01L 33/38 257/98 |
| 2011/0108872 A1 | 5/2011 | Kim | |
| 2011/0168971 A1* | 7/2011 | Song | H01L 33/0079 257/13 |
| 2014/0306254 A1* | 10/2014 | Song | H01L 33/0079 257/98 |

* cited by examiner

*Primary Examiner* — Tram H Nguyen

(57) ABSTRACT

A light-emitting device is provided, including: a substrate; a reflective layer disposed on the substrate; a patterned contact layer disposed on the reflective layer; a light-emitting unit disposed on the patterned contact layer; a first electrode disposed on a top surface of the light-emitting unit; and a second electrode disposed on a bottom surface of the light-emitting unit; wherein a projection of the first electrode on the substrate and a projection of the patterned contact layer on the substrate are complementary to each other.

19 Claims, 4 Drawing Sheets

LIGHT-EMITTING DEVICE

CROSS REFERENCE TO RELATED APPLICATIONS

This application claims priority of Taiwan Patent Application No. 104118713, filed on Jun. 10, 2015, the entirety of which is incorporated by reference herein.

TECHNICAL FIELD

The present invention relates to a light-emitting device, and in particular it relates to a light-emitting diode (LED).

BACKGROUND

A light-emitting diode is a type of semiconductor device. Development of LEDs has been vigorous due to its many advantages, including its small size, luminesence, short reaction time, long life time, and low power consumption. Generally, LED chips can be classified into two main categories: those with lateral structures and those with vertical structures. With lateral structures, the two electrodes of an LED chip are located on the same side of the LED chip. With vertical structures, the two electrodes of an LED chip are located on opposite sides of the LED chip. LEDs having a vertical structure can improve upon issues of current spreading, which occurs in LEDs having a lateral structure. LEDs with a vertical structure have better performance in current spreading, thermal cooling, and emission efficiency, and may solve the problem of light shielding caused by the electrodes, and thus increase the emission area of LEDs. Therefore, LEDs having a vertical structure have drawn more and more attention from researchers. The vertical structure is expected to become the main LED chip structure in the future, especially for application in the field of general lighting.

Although existing LED manufacturing processes have generally been adequate for their intended purposes, they have not been entirely satisfactory in all respects. There are still many aspects of existing LED manufacturing processes that need to be improved.

BRIEF SUMMARY OF THE DISCLOSURE

An embodiment of the present invention provides a light-emitting device, comprising: a substrate; a reflective layer disposed on the substrate; a patterned contact layer disposed on the reflective layer; a light-emitting unit disposed on the patterned contact layer; a first electrode disposed on an upper surface of the light-emitting unit; and a second electrode disposed on a lower surface of the substrate, wherein a projection of the first electrode and a projection of the patterned contact layer on the substrate are complementary to each other.

In the light-emitting device described above, a part of the reflective layer is disposed across the patterned contact layer and connected to the light-emitting unit. The patterned contact layer and the light-emitting unit form an ohmic contact. The reflective layer and the light-emitting unit do not form an ohmic contact.

Another embodiment of the present invention provides a light-emitting device, comprising: a substrate; a first reflective layer disposed on the substrate; a patterned second reflective layer disposed on the first reflective layer; a light-emitting unit disposed on the patterned second reflective layer; a first electrode disposed on an upper surface of the light-emitting unit; and a second electrode disposed on a lower surface of the substrate, wherein a projection of the first electrode and a projection of the patterned second reflective layer on the substrate are complementary to each other.

In the light-emitting device described above, a part of the first reflective layer is disposed across the patterned second reflective layer and connected to the light-emitting unit. The patterned second reflective layer and the light-emitting unit form an ohmic contact. The first reflective layer and the light-emitting unit do not form an ohmic contact.

DETAILED DESCRIPTION

Figure 1:
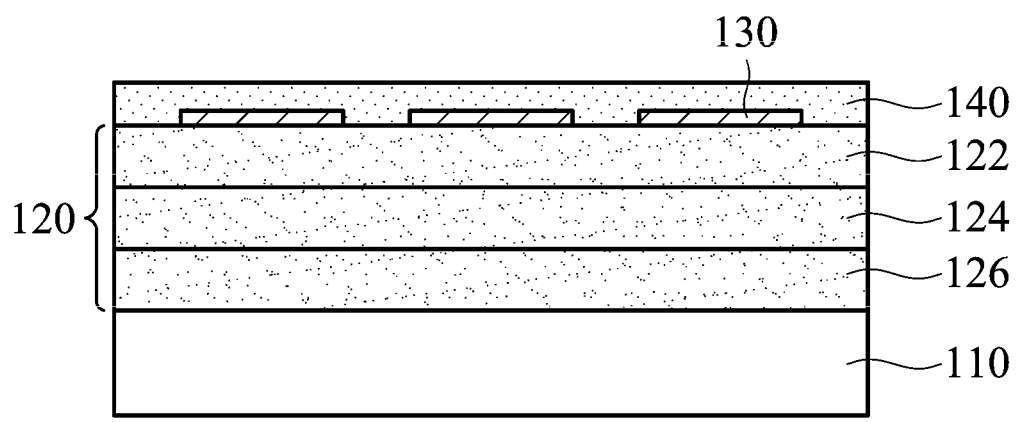
FIG. 1 is a cross-sectional view of a light-emitting device during the stages of fabrication, in accordance with some embodiments.

The present invention can be more fully understood by reading the subsequent detailed description and examples with references made to the accompanying drawings. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

It should be appreciated that specific examples of components and arrangements are described below to simplify the present invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact.

Furthermore, spatially relative terms, such as "lower," "upper," "above," "below," "over," "under," "on" "beneath," "top," "bottom," and the like (for example, "upward," "downward," etc.), may be used herein for ease of description to describe elements as illustrated in the figures. The spatially relative terms are used to simplify the present invention, and are not intended to limit the device must be used or operated in an certain orientation.

Moreover, according to common practice, the various features of the drawings are not necessarily to scale. On the contrary, the dimensions of the various features are arbitrarily expanded or reduced for clarity. In addition, the present invention may repeat reference numerals and/or letters in the various examples. This repetition is for the purpose of simplicity and clarity and does not in itself dictate a relationship between the various embodiments and/or configurations discussed.

According to the conventional LED structure, LED chips normally include a current blocking layer, details of which can be found in US Patent Application No. 20130221320 A1 or Chinese Patent Application No. 101075651A. Generally, an LED chip having a vertical structure includes a reflective layer at the bottom so as to reflect the light being emitted from the light-emitting layer. Moreover, an LED chip having a vertical structure includes a current blocking layer disposed below or directly below the upper electrode, and it may increase the current spreading range to prevent the current crowding effect.

However, the current blocking layer may have a negative impact on the reflective layer (e.g. decreasing the reflection area of the reflective layer or shielding the light reflected by the reflecting layer), and decrease the light intensity of the device. Moreover, the current blocking layer normally includes insulating materials, for example, dielectric materials. Therefore, the formation of the current blocking layer involves depositing and patterning dielectric materials. However, these processes not only require additional manufacturing tools but also may affect the performance of the devices through, for example, current leakage and/or operating voltage increases due to non-uniform surfaces on the devices.

To overcome the problem described above, an embodiment of the present invention provides an improved structural design for the contact layer and the reflective layer in the LED. With this design, the contact layer and the reflective layer are integrated, and the projections of the contact layer and the upper electrode on the substrate are complementary. With the positional arrangement of the contact layer, the reflective layer and the upper electrode, and the electrical connections of the contact layer, the reflective layer and the light-emitting unit, the improved structural design of the contact layer and the reflective layer may provide a function that is equivalent to that of the current blocking layer, but without damaging the reflection effect of the reflective layer.

Figure 2:
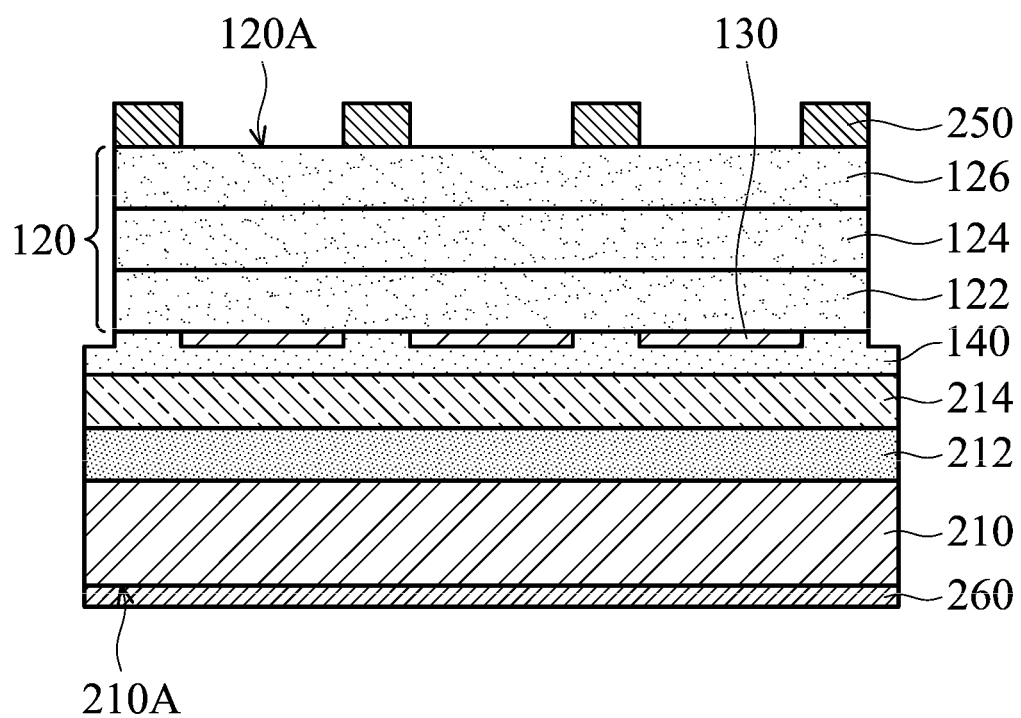
FIG. 2 is a cross-sectional view of a light-emitting device, in accordance with some embodiments.

The following illustrates a light-emitting device using an improved structural design of contact layer and reflective layer, and the manufacturing method thereof, in accordance with some embodiments of the invention. FIG. 1 is a cross-sectional view of a light emitting diode 200 during the stages of fabrication, in accordance with some embodiments. FIG. 2 is a cross-sectional view of a light emitting diode 200, in accordance with some embodiments. Referring to FIG. 2, the light emitting diode 200 includes a substrate 210, a bonding layer 212, a barrier layer 214, a reflective layer 140, a patterned contact layer 130, a light emitting unit 120, a first electrode 250 and a second electrode 260. The bonding layer 212, the barrier layer 214, the reflective layer 140, the patterned contact layer 130 and the light emitting unit 120 are sequentially stacked on the substrate 210. The first electrode 250 and the second electrode 260 are disposed on the upper surface 120A of the light emitting unit 120 and the lower surface 210A of the substrate 210, respectively.

Referring to FIG. 1, first, in the manufacturing method of the light emitting diode 200, a light emitting unit 120 is formed on the epitaxial substrate 110. The light emitting unit 120 includes a second type semiconductor layer 126, a light-emitting layer 124 and a first type semiconductor layer 122 sequentially stacked on the epitaxial substrate 110.

The epitaxial substrate 110 may include sapphire substrates ($Al_2O_3$), silicon substrates or silicon carbide (SiC) substrates, and the substrate may be doped or non-doped. Moreover, the substrate may have different crystalline orientations, such as (111), (100) or (110) etc.

Generally, the first type semiconductor layer 122 and the second type semiconductor layer 126 are semiconductor layers with different doping types, such as p-type semiconductor layers and n-type semiconductor layers. For example, the first type semiconductor layer 122 of the light-emitting unit 120 may be formed by the III-V compounds having dopants of the first conductivity type, e.g. gallium nitride having p-type conductivity (p-GaN). The second type semiconductor layer 126 may be formed by the III-V compounds having dopants of the second conductivity type, e.g. gallium nitride having n-type conductivity (n-GaN).

In some embodiments, the first type semiconductor layer 122 and the second type semiconductor layer 126 may be formed by an epitaxial growth process; for example, metal organic chemical vapor deposition (MOCVD), molecular beam epitaxy (MBE), hydride vapor phase epitaxy (HYPE), liquid phase epitaxy (LPE), or another suitable chemical vapor deposition process. Other III-V compounds may be used, such as indium nitride (InN), aluminum nitride (AlN), indium gallium nitride ($In_xGa_{(1-x)}N$), aluminum gallium nitride ($Al_xGa_{(1-x)}N$) or aluminum indium gallium nitride ($Al_xIn_yGa_{(1-x-y)}N$), wherein $0<x\leq1$, $0<y\leq1$ and $0\leq x+y\leq1$.

The light-emitting layer 124 is sandwiched between the PN interface formed by the first type semiconductor layer 122 and the second type semiconductor layer 126 to adjust the properties and improve the performance of the device. The light-emitting layer 124 may include a homogeneous interface, a heterogeneous interface, a single quantum well (SQW) or a multiple quantum well (MQW). Similarly, the light-emitting layer 124 may be formed by metal organic chemical vapor deposition (MOCVD), molecular beam epitaxy (MBE), hydride vapor phase epitaxy (HPVE), liquid phase epitaxy (LPE), or other suitable chemical vapor deposition process.

Next, still referring to FIG. 1, the patterned contact layer 130 and the reflective layer 140 are sequentially formed on the first type semiconductor layer 122 of the light-emitting unit 120. In some embodiments, the reflective layer 140 may be a continuous layer, and a part of the reflective layer 140 is disposed across the patterned contact layer 130 and connected to the light-emitting unit 120. As shown in FIG. 1, the patterned contact layer 130 is embedded in the reflective layer 140.

The contact layer (not shown) may be deposited on the first type semiconductor layer 122 first, and it may be lithographed to form the patterned contact layer 130. Then, the reflective layer 140 may be conformally deposited on the patterned contact layer 130. The deposition processes used for forming the reflective layer 140 and the patterned contact layer 130 may include physical vapor deposition (PVD), chemical vapor deposition (CVD), atomic layer deposition (ALD), and other suitable processes.

In some embodiments, the material of the reflective layer 140 may include metals. For example, the material of the reflective layer 140 may include, but is not limited to, Cu, Al, In, Ru, Sn, Au, Pt, Zn, Ag, Ti, Pb, Ni, Cr, Mg, Pd or a combination thereof. In some embodiments, the material of the patterned contact layer 130 may include transparent conductive oxides (TCO) or metals. For example, transparent conductive oxides may include, but is not limited to, $In_2O_3$, indium tin oxide (ITO), $SnO_2$, ZnO, aluminum-doped zinc oxide (AZO) or indium zinc oxide (IZO), and metals may include, but are not limited to, Cu, Al, In, Ru, Sn, Au, Pt, Zn, Ag, Ti, Pb, Ni, Cr, Mg, Pd or a combination thereof.

In this design, a better electrical connection may be formed between the patterned contact layer 130 and the light-emitting unit 120 while a worse electrical connection is formed between the reflective layer 140 and the light-emitting unit 120 so as to provide an effect similar to the current blocking layer directly below the first electrode 250, which is formed afterward, and thus may prevent current conduction in the shortest pathway (straight line). Moreover, the material of the patterned contact layer 130 formed in the reflective layer 140 may include a transparent conductive material. Therefore, the light reflected by the reflective layer 140 will not be shielded, and the problem of a light-intensity decrease in devices may be prevented.

After performing the processes described above, referring to FIG. 2, the stacking structure (including the reflective layer 140, the patterned contact layer 130 and the light-emitting unit 120) formed on the epitaxial substrate 110 is bonded to the substrate 210 through the bonding layer 212 formed on the substrate 210, and the epitaxial substrate 110 is then removed from the stacking structure. In some embodiments, the reflective layer 140 of the stacking structure is bonded to the substrate 210 through the bonding layer 212. That is, the bonding layer 212 is disposed between the substrate 210 and the reflective layer 140 to provide adhesion. In some embodiments, the substrate 210 may be silicon substrates, circuit boards, metal substrates, or the like. In some embodiments, the materials of the bonding layer may include metallic materials or organic materials having conductive particles.

In some embodiments, the barrier layer 214 may be formed between the bonding layer 212 and the reflective layer 140 to prevent metal diffusion of the reflective layer 140 from the substrate 210. For example, the material of the barrier layer 214 may include Ta, TaN, Ti, TiN, Co, W, or a combination thereof. The barrier layer 214 may be formed by physical vapor deposition (PVD), chemical vapor deposition (CVD), atomic layer deposition (ALD), or another suitable process.

Finally, the first electrode 250 is disposed on the second type semiconductor layer 126 of the light-emitting unit 120, and the second electrode 260 is disposed on the side of the substrate 210 opposite to the bonding layer 212. The light-emitting diode 200 is accomplished thereby.

Figure 3A:
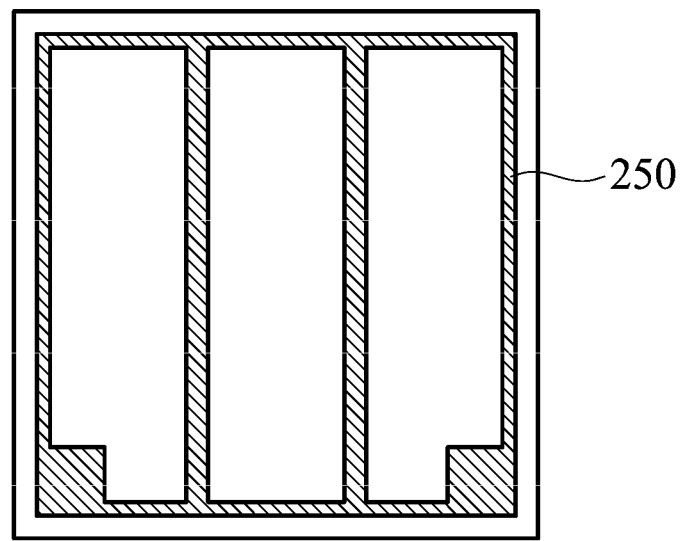
FIGS. 3A-3B are schematic drawings of the projections of partial structures of the light-emitting device on the substrate, in accordance with some embodiments.
Figure 3B:
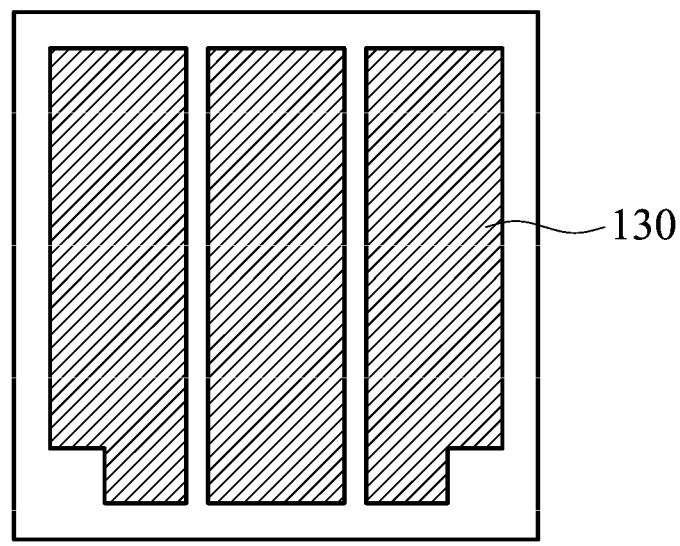

Referring to FIG. 2 again, as described above, a poor electrical connection is formed between the reflective layer 140 and the light-emitting unit 120 directly below the first electrode 250 so as to provide an effect similar to the current blocking layer. That is, in the direction perpendicular to the substrate, the patterned contact layer 130 and the first electrode 250 are dislocated. More specifically, in the direction perpendicular to the substrate, the patterned contact layer 130 is not formed at the position corresponding to the first electrode 250. Referring to FIG. 3A-3B, FIG. 3A is a schematic drawing illustrating the projections of the first electrode 250 of the light-emitting diode 200 on the substrate 210, and FIG. 3B is a schematic drawing illustrating the projections of the patterned contact layer 130 of the light-emitting diode 200 on the substrate 210. As shown in FIGS. 3A-3B, the projections of the patterned contact layer 130 and the first electrode 250 on the substrate 210 are complementary. In other words, in the direction perpendicular to the substrate, the positions of the patterned contact layer 130 and the first electrode 250 do not overlap.

In some embodiments, the patterned contact layer 130 and the light-emitting unit 120 form an ohmic contact to provide a better electrical connection. On the other hand, the reflective layer 140 and the light-emitting unit 120 do not form an ohmic contact, and thus it provides an effect similar to the current blocking layer directly below the first electrode 250. In some embodiments, the material of the patterned contact layer 130 is indium tin oxide (ITO), and it is easy to form an ohmic contact with the first type semiconductor layer 122 (p-GaN) of the light-emitting unit 120 to provide better electrical connections. Moreover, indium tin oxide (ITO) is transparent, so the light reflected by the reflective layer 140 will not be blocked or shielded. In some embodiments, the material of the reflective layer 140 is silver or aluminum to provide better reflecting effect, and it will not form an ohmic contact with the first type semiconductor layer 122 (p-GaN).

In the embodiments described above, the patterned contact layer and the reflective layer are integrated into a monolayer structure. That is, the patterned contact layer is arranged in the reflective layer, and thus the light reflected by the reflective layer will not be blocked or shielded. Moreover, compared with the reflective layer, a better electrical connection is provided between the patterned contact layer and the light-emitting unit. Accordingly, by adjusting the positions of the patterned contact layer, the effect of current blocking may be achieved. Therefore, the light-emitting diode structure provided does not require additional processes to form a current blocking layer, while the effect of current spreading may still be achieved. The problem of light intensity decrease due to the fact that the reflective layer is shielded by the current blocking layer may also be avoided.

Another embodiment of the present invention provides an improved reflection structure in the LED. The improved reflection structure includes a patterned reflective layer and a continuous reflective layer. The patterned reflective layer is integrated into the continuous reflective layer, and the projections of the patterned reflective layer and the upper electrode on the substrate are complementary. With the positional arrangement of the patterned contact layer, the continuous reflective layer, and the upper electrode, and the electrical connections of the patterned contact layer, the continuous reflective layer and the light-emitting unit, the improved reflection structure may serve as a reflective layer, and provide a function that is equivalent to that of the current blocking layer.

Figure 4:
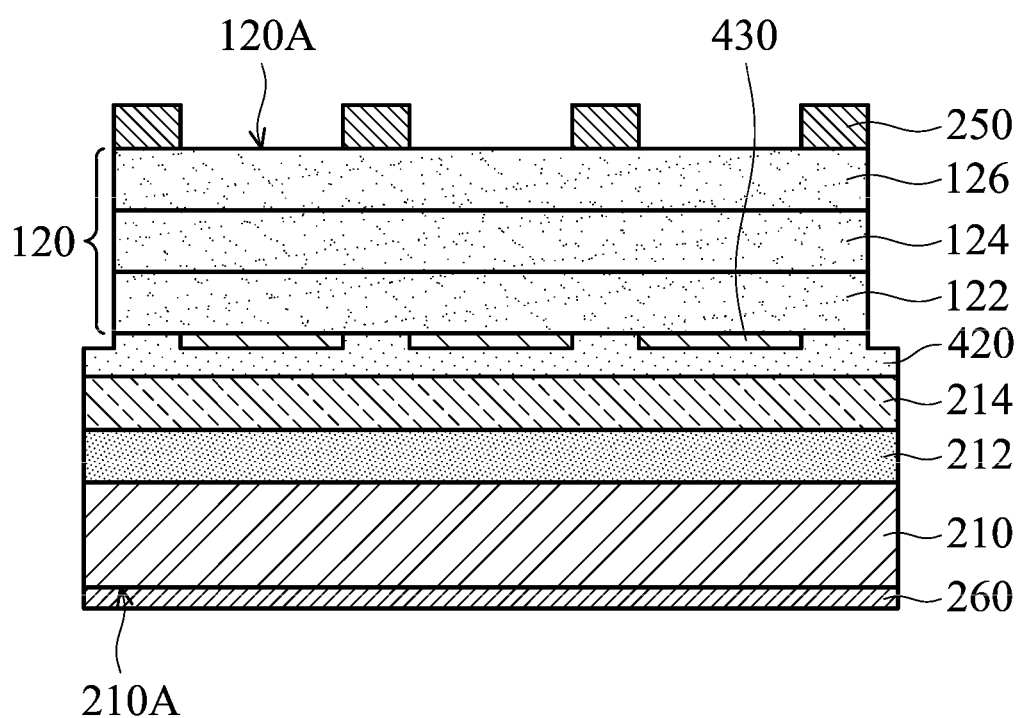
FIG. 4 is a cross-sectional view of a light-emitting device, in accordance with some other embodiments.

FIG. 4 is a cross-sectional view of a light-emitting diode 400, in accordance with some other embodiments. Referring to FIG. 4, the light-emitting diode 400 includes a substrate 210, a bonding layer 212, a barrier layer 214, a first reflective layer 420, a patterned second reflective layer 430, a light-emitting unit 120, a first electrode 250, and a second electrode 260. The light-emitting unit 120 further includes a first type semiconductor layer 122, a light-emitting layer 144 and a second type semiconductor layer 146. The bonding layer 212, the barrier layer 214, the first reflective layer 420, the patterned second reflective layer 430, and the light-emitting unit 120 are sequentially stacked on the substrate 210. The first electrode 250 and the second electrode 260 are disposed on the upper surface 120A of the light-emitting unit 120, and the lower surface 210A of the substrate 210, respectively. The structure of the light-emitting diode 400 is substantially the same as the structure of the light-emitting diode 200, except that the patterned contact layer 130 and the reflective layer 140 of the light-emitting diode 200 are replaced with the patterned second reflective layer 430 and the first reflective layer 420 in the light-emitting diode 400, respectively.

The structures of the light-emitting unit 400 corresponding to those in the light-emitting unit 200 may be formed by the same materials and processes as described above, which will not be repeated herein. The first reflective layer 420 in the light-emitting diode 400 is substantially the same as the reflective layer 140 in the light-emitting diode 200. The structure of the patterned second reflective layer 430 in the light-emitting diode 400 is substantially the same as the one of the patterned contact layer 130 in the light-emitting diode 200. As described above, after the formation of the light-emitting unit 120, the patterned second reflective layer 430 and the first reflective layer 420 may be sequentially formed on the first type semiconductor layer 122 of light-emitting unit 120. For example, the reflective material layer (not shown) may be deposited on the first type semiconductor layer 122 of the light-emitting unit 120 first, and it may be lithographed to form the patterned second reflective layer 430. Then, the first reflective layer 420 may be conformally deposited on the patterned second reflective layer 430.

In some embodiments, the first reflective layer 420 may be a continuous layer, and a part of the first reflective layer 420 is disposed across the patterned second reflective layer 430 and connected to the light-emitting unit 120. In some embodiments, in the direction perpendicular to the substrate, the patterned second reflective layer 430 and the first electrode 250 are dislocated. Moreover, the projections of the first electrode 250 and the patterned second reflective layer 430 on the substrate 210 are complementary to each other. A poor electrical connection is formed between the first reflective layer 420 and the light-emitting unit 120 so as to provide an effect that is similar to that of the current blocking layer directly below the first electrode 250. In some embodiments, the patterned second reflective layer 430 and the light-emitting unit 120 form an ohmic contact. The first reflective layer 420 and the light-emitting unit 120 do not form an ohmic contact.

The first reflective layer 420 and the patterned second reflective layer 430 may be formed of the same material or of different materials. In some embodiments, the materials of the first reflective layer 420 and the patterned second reflective layer 430 may include metals. For example, the materials of the first reflective layer 420 and the patterned second reflective layer 430 may include, but are not limited to, Cu, Al, In, Ru, Sn, Au, Pt, Zn, Ag, Ti, Pb, Ni, Cr, Mg, Pd or a combination thereof.

For example, in some embodiments, the material of the first reflective layer 420 may be aluminum, and the material of the patterned second reflective layer 430 may be silver. Compared with aluminum, it is easier for silver to form an ohmic contact with the light-emitting unit 120 so as to provide better electrical connections. In other embodiments, the materials of the first reflective layer 420 and the patterned second reflective layer 430 are both silver. After the formation of the patterned second reflective layer 430, it is annealed to form an ohmic contact with the light-emitting unit 120. After formation of the first reflective layer 420, it is not annealed, and thus does not form an ohmic contact with the light-emitting unit 120.

In the embodiments described above, a better electrical connection is provided between the patterned second reflective layer and the light-emitting unit. By adjusting the position of the patterned second reflective layer, the improved reflection structure may achieve current spreading effects equivalent to a current blocking layer without damaging the reflection ability. Therefore, the light-emitting diode structure provided may achieve the effect of current spreading without additional processes to form a current blocking layer. Moreover, the problem of light intensity decrease due to the fact that the reflective layer is shielded by the current blocking layer may also be avoided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light-emitting device, comprising:
   a substrate;
   a reflective layer disposed on the substrate;
   a patterned contact layer disposed on the reflective layer;
   a light-emitting unit disposed on the patterned contact layer;
   a first electrode disposed on an upper surface of the light-emitting unit; and
   a second electrode directly disposed on a rear surface of the substrate, wherein a projection of the first electrode and a projection of the patterned contact layer on the substrate are complementary to each other, wherein a part of the reflective layer is disposed across the patterned contact layer and directly contacting the light-emitting unit.

2. The light-emitting device as claimed in claim 1, wherein the patterned contact layer and the light-emitting unit form an ohmic contact.

3. The light-emitting device as claimed in claim 1, wherein the reflective layer and the light-emitting unit do not form an ohmic contact.

4. The light-emitting device as claimed in claim 1, wherein the light-emitting unit comprises a first type semiconductor layer, a light-emitting layer and a second type semiconductor layer stacked sequentially.

5. The light-emitting device as claimed in claim 1, wherein the reflective layer is a continuous layer.

6. The light-emitting device as claimed in claim 1, wherein the material of the reflective layer is metal.

7. The light-emitting device as claimed in claim 1, wherein the material of the reflective layer comprises Cu, Al, In, Ru, Sn, Au, Pt, Zn, Ag, Ti, Pb, Ni, Cr, Mg, Pd or a combination thereof.

8. The light-emitting device as claimed in claim 1, wherein the material of the patterned contact layer comprises In2O3, indium tin oxide (ITO), SnO2, ZnO, aluminum-doped zinc oxide (AZO), indium zinc oxide (IZO), Cu, Al, In, Ru, Sn, Au, Pt, Zn, Ag, Ti, Pb, Ni, Cr, Mg, Pd or a combination thereof.

9. The light-emitting device as claimed in claim 1, further comprising a bonding layer disposed between the reflective layer and the substrate.

10. The light-emitting device as claimed in claim 8, further comprising a barrier layer disposed between the bonding layer and the reflective layer.

11. A light-emitting device, comprising:
    a substrate;
    a first reflective layer disposed on the substrate;
    a patterned second reflective layer disposed on the first reflective layer;
    a light-emitting unit disposed on the patterned second reflective layer;
    a first electrode disposed on an upper surface of the light-emitting unit; and
    a second electrode directly disposed on a rear surface of the substrate, wherein a projection of the first electrode and a projection of the patterned second reflective layer on the substrate are complementary to each other, wherein a part of the first reflective layer is disposed across the patterned second reflective layer and directly contacting the light-emitting unit.

12. The light-emitting device as claimed in claim 11, wherein the patterned second reflective layer and the light-emitting unit form an ohmic contact.

13. The light-emitting device as claimed in claim 11, wherein the first reflective layer and the light-emitting unit do not form an ohmic contact.

14. The light-emitting device as claimed in claim 11, wherein the light-emitting unit comprises a first type semiconductor layer, a light-emitting layer and a second type semiconductor layer stacked sequentially.

15. The light-emitting device as claimed in claim 11, wherein the first reflective layer is a continuous layer.

16. The light-emitting device as claimed in claim 11, wherein the material of the first reflective layer is metal.

17. The light-emitting device as claimed in claim 11, wherein the material of the first reflective layer comprises Cu, Al, In, Ru, Sn, Au, Pt, Zn, Ag, Ti, Pb, Ni, Cr, Mg, Pd or a combination thereof.

18. The light-emitting device as claimed in claim 11, wherein the material of the patterned second reflective layer comprises Cu, Al, In, Ru, Sn, Au, Pt, Zn, Ag, Ti, Pb, Ni, Cr, Mg, Pd or a combination thereof.

19. The light-emitting device as claimed in claim 11, further comprising a bonding layer disposed between the first reflective layer and the substrate.

* * * * *